United States Patent [19]
Parkes et al.
[11] Patent Number: 4,464,727
[45] Date of Patent: Aug. 7, 1984

[54] PARABOLIC FUNCTION GENERATOR

[75] Inventors: Christopher W. Parkes, East Palo Alto; Robert C. Franklin, Los Gatos, both of Calif.

[73] Assignee: Beckman Instruments, Inc., Fullerton, Calif.

[21] Appl. No.: 301,074

[22] Filed: Sep. 10, 1981

[51] Int. Cl.³ ..... H03K 13/02
[52] U.S. Cl. ..... 364/718; 364/608; 364/722; 364/852; 340/347 DA
[58] Field of Search ..... 340/347 DA; 364/718, 364/721, 722, 851, 852, 857, 807, 813, 817, 607, 608; 318/603

[56] References Cited

U.S. PATENT DOCUMENTS

| | | | |
|---|---|---|---|
| 3,679,879 | 7/1972 | Seki et al. | 364/718 |
| 3,689,914 | 9/1972 | Butler | 364/718 |
| 3,828,168 | 8/1974 | O'Callaghan et al. | 318/603 |
| 3,962,573 | 6/1976 | Staley | 364/718 |
| 4,020,485 | 4/1977 | Busby | 364/851 |

*Primary Examiner*—Gareth D. Shaw
*Assistant Examiner*—Karl Huang
*Attorney, Agent, or Firm*—R. J. Steinmeyer; F. L. Mehlhoff; G. T. Hampson

[57] ABSTRACT

A function generator responsive to clock pulses for developing an analog signal in the form of a digitally approximated parabola.

3 Claims, 3 Drawing Figures

PARABOLIC FUNCTION GENERATOR

BACKGROUND OF THE INVENTION

1. Field of the Invention

The present invention relates to function generators and, more particularly, to digital generators of parabolic functions.

2. Description of the Prior Art

Digital function generators have been developed for controlling the operation of motors and other loads in accordance with a predetermined output function. Such function generators receive successive clock pulses and develop an output analog control signal having a value which is a predetermined function of the cumulative number of clock pulses received. The analog control signal is applied as a control input to the motor or other load for controlling operation thereof in accordance with the function represented by the analog signal.

While generators of the foregoing type have found widespread use, they often are relatively complex, and expensive and are adapted for use only in particular applications. As a result, a need exists for simpler and more universally applicable generators.

SUMMARY OF THE INVENTION

The present invention resides in a novel function generator for developing a parabolic function in a simple and straightforward manner. The generator receives successive clock pulses producing an output signal whose value is a parabolic function of the cumulative number of clock pulses received.

To the foregoing ends, the function generator comprises pulse counter means for receiving the clock pulses, multiplier means for producing an analog product signal, offset means for producing an analog offset signal and summing means for producing an output signal as the sum of the product signal and the offset signal. Incrementing of the pulse counter means increments the output signal in step-like fashion for a predetermined number of steps of a predetermined step size or slope value. At the completion of one incrementing or counting cycle the output signal is again incremented but at a new voltage step size greater than that of the preceding incrementing cycle. The voltage step size is increased with each successive incrementing cycle to thereby develop the output signal as a digitally approximated parabola.

DESCRIPTION OF THE PREFERRED EMBODIMENT

Figure 1:
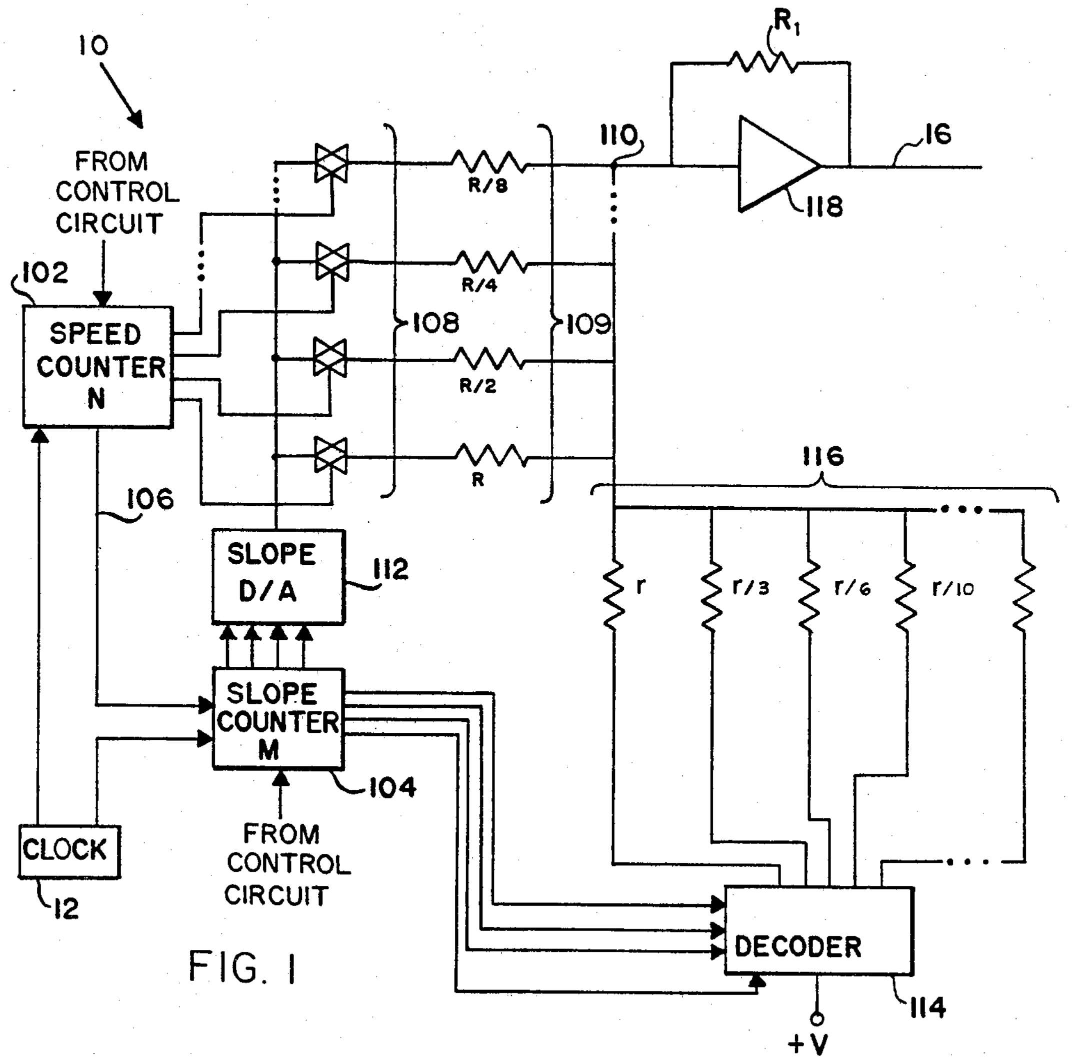
FIG. 1 is a block diagram of the function generator of the invention for generating a digitally approximated parabola.

FIG. 1 illustrates a function generator 10 for generating the reference curve in the form of a digitally approximated parabola. The generator 10 is employed in a centrifuge rotor drive motor control system for controlling acceleration and deceleration of the centrifuge rotor in accordance with a parabolic function. However, the function generator is useful in other applications in which such parabolic functions are desired.

Figure 2:
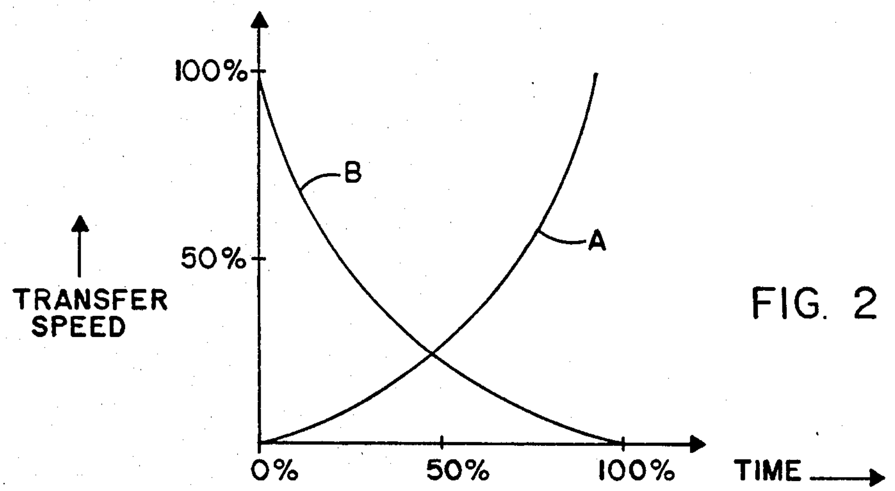
FIG. 2 is a graphical illustration of two parabolic reference curves A and B produced by the FIG. 1 generator.

In the centrifuge control system, the function generator 10 develops, referring to FIG. 2, a rotor acceleration reference curve A and a rotor deceleration reference curve B. Later reference to acceleration and deceleration is in reference to such rotor operation.

Function generator 10 comprises four basic subsystems which cooperate to generate the reference speed voltage output on line 16. The subsystems include pulse counter means (102, 104) for receiving the clock pulses, multiplier means (112, 108, 109) for producing an analog product signal, offset means (114, 116) for producing an analog offset signal, and summing means (110, 118) for producing an output signal as the sum of the product signal and the offset signal.

The pulse counter means comprises a speed counter 102 and a slope counter 104 each receiving as an input thereto the clock pulse output of clock 12. The arrangement of counters 102 and 104 is such that counter 102 produces an N-digit digital mantissa output and counter 104 produces an M-digit digital slope output consisting, respectively, of the N least significant digits and M most significant digits of the counter means output. M and N represent positive integers whose sum equals the predetermined number of digits in the counter means output. The counters each receive control signals from a signal control circuit (not shown) conditioning the counters to count either up (to execute "gradual acceleration") or down (to execute "gradual deceleration").

The carry output 106 of speed counter 102 is connected as an input to slope counter 104. In the preferred embodiment speed counter 102 and slope counter 104 are four digit binary counters (i.e. $M=N=4$).

The multiplier means comprises slope digital-to-analog converter 112, analog switch array 108 and resistance array 109 connected to the digital mantissa output of counter 102 and to the digital slope output of counter 104. The multiplier means produces an analog product signal whose value equals a proportionality constant multiplied by the product of a mantissa number (i.e. the number represented by the digital mantissa output of counter 102) and a slope number (i.e. equal to 1 plus the number represented by the digital slope output of counter 104).

The output lines of counter 102 are connected as control or gate inputs to respective analog switches of switch array 108 the outputs of which are in turn coupled through respective resistors of resistance array 109 to summing node 110. The output lines of slope counter 104 are connected to slope digital-to-analog converter 112 the output of which is in turn connected to the inputs of each of the analog switches of array 108.

D-to-A converter 112 produces a D to A output analog slope voltage proportional to the sun of the number one and the number represented by the digital slope output of counter 104 whereby the analog slope voltage is proportional to the slope number.

Analog switches of array 108, as gated by the appropriate output lines of counter 102, connect respective resistors of array 109 (whose resistance values are inversely proportional to the numbers represented by the respective digital mantissa outputs of counter 102) between node 110 and the output of converter 112. The current conducted through the array is thereby proportional to the product of the mantissa number and the slope number.

The offset means for producing the analog offset signal comprises a decoder 114 and a resistance array 116. A second set of output lines of slope counter 104 is connected as an input to the decoder. The output lines of the decoder in turn connect selected resistors of array 116 between a source of voltage +V and node 110.

The value of the selected resistor of array 116 connected between voltage source +V and node 110 is inversely proportional to the product of the slope number and a quantity equal to the slope number minus 1 whereby a current proportional to the analog offset signal flows through the selected resistance. Therefore, the offset means connected to the digital slope output of counter 104 produces an analog offset signal at node 110 whose value equals the proportionality constant, multiplied by a quantity equal to the maximum mantissa number plus one, multiplied by the slope number, multiplied by a quantity equal to the slope number minus 1, divided by 2.

The fourth subsystem, namely the summing means for producing the function generator output signal at 16, is comprised of summing node 110 and operational amplifier 118 having an inverting input and an output between which a resistance $R_1$ is connected. Node 110 is connected to the inverting input of the amplifier. The summing means, as connected to the multiplier means and the offset means, produces the function generator output signal at 16 proportional to the sum of the product signal and the offset signal.

Figure 3:
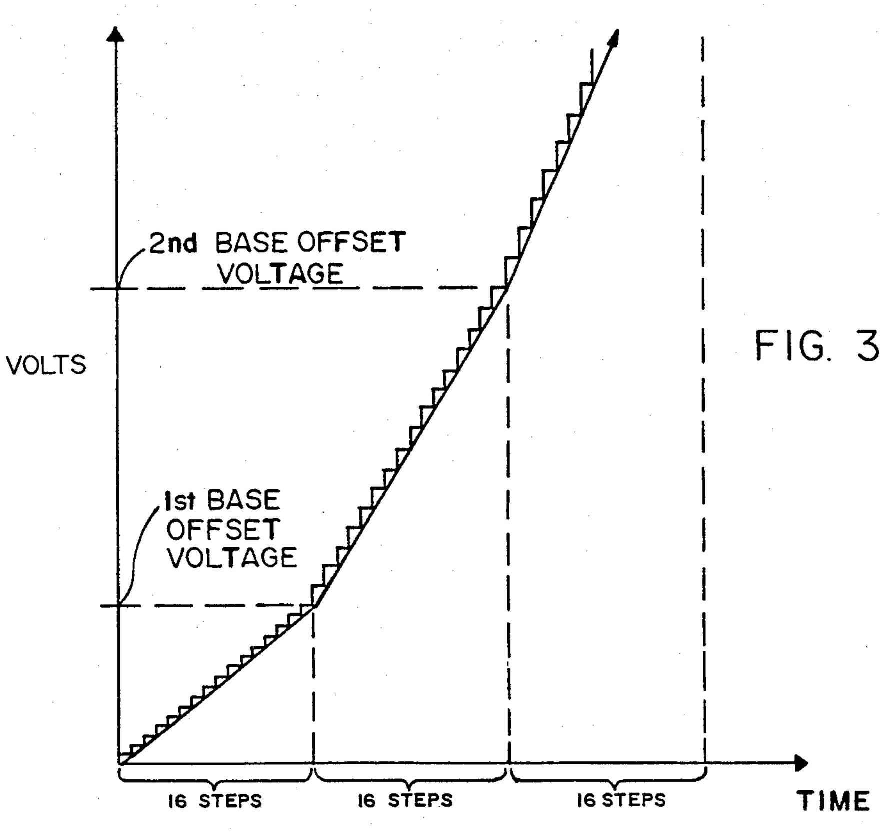
FIG. 3 is a simplified illustration of a parabolic reference curve like curve A comprising sets of voltage step-like increments defining a parabolic curve.

Before considering the operation of function generator 10, reference is made to FIG. 3 which depicts the nature of the parabolic function corresponding to acceleration reference curve A (FIG. 2) generated by the FIG. 1 function generator. The reference curve A comprises ten sets of sixteen equal voltage steps. For simplicity of illustration the curve of FIG. 3 shows only three such sets. The vertical height of the voltage steps within each set is constant. However, the vertical step height increases with each new set of steps to thereby develop the parabolic function illustrated. The voltage level at the end of the first set (termed the first base offset voltage) provides a base level from which the second set of steps builds. The voltage level at the end of the second set (termed the second base offset voltage) provides a base level from which the third set of steps builds, and so on through the ten sets.

Returning to FIG. 1, the carry output of speed counter 102 is connected to increment slope counter 104 one count each time the speed counter executes a full count. Initially both counters are set to zero. On the first pulse from clock 12 speed counter 102 counts to 0001 (in the preferred embodiment) thereby generating a control signal on its least significant output (bottom line) turning on the bottom analog switch of array 108 such that the switch passes therethrough the slope voltage output of converter 112. Such produces the first of sixteen output voltage step levels of the set. Subsequent clock pulses cause the output of speed counter 102 to enable the remaining analog switches of array 108 in a binary fashion to generate further voltage step levels of the set. On the sixteenth clock pulse, speed counter 102 counts to 0000 and triggers the carry output 106 to slope counter 104. The slope counter in response increments the value of its output slope voltage applied via D-to-A converter 112 to the inputs of the analog switches of array 108. The slope counter also triggers decoder 114 which in turn enables a selected resistor of array 116 to supply a first analog offset signal to node 110. The analog offset signal establishes a base offset voltage level for the following set of sixteen voltage steps.

Speed counter 102 then again begins to count from 0000 to 1111 and enable switches 108 as aforedescribed to generate a second set of voltage steps which build upon the base offset voltage level previously established. For this counting cycle, however, switch array 108 passes a slope voltage of a larger voltage value (i.e. larger step size) than that of the preceding counting cycle because the slope voltage output of converter 112 was incremented, as aforedescribed, at the end of the preceding cycle.

The process continues through ten sets of sixteen steps with the voltage step increasing in height for each new set. At the end of each set a new base offset voltage level is established from which the following set builds.

While a preferred embodiment of the invention has been illustrated and described, it will be apparent that modifications may be made therein without departing from the scope of the invention as set forth in the appended claims.

What is claimed is:

1. A parabolic function generator for receiving successive clock pulses and for producing a generator output signal whose value is a parabolic function of the cumulative number of clock pulses received, comprising:

pulse counter means for receiving the clock pulses, for producing a digital counter output comprising a predetermined number of digits, for changing the counter output by one count each time a clock pulse is received, and for producing an N-digit digital mantissa output and an M-digit digital slope output consisting of the N least significant digits and M most significant digits, respectively, of the counter output, wherein M and N represent positive integers whose sum equals said predetermined number of digits in the counter output;

multiplier means, connected to the digital mantissa output and the digital slope output, for producing an analog product signal whose value equals a proportionality constant multiplied by the product of a mantissa number and a slope number, the mantissa number being the number represented by the digital mantissa output and the slope number being equal to one plus the number represented by the digital slope output;

offset means, connected to the digital slope output, for producing an analog offset signal whose value equals said proportionality constant, multiplied by a quantity equal to the maximum mantissa number plus one, multiplied by said slope number, multiplied by a quantity equal to said slope number minus one, divided by two; and summing means, connected to the multiplier means and the offset means, for producing the generator output signal proportional to the sum of the product signal and the offset signal.

2. A function generator according to claim 1, wherein the multiplier means comprises a multiplying digital-to-analog converter.

3. A function generator according to claim 1, wherein:

the summing means comprises:

an operational amplifier having an inverting input and an output between which an impedance is connected;

the multiplier means comprises:

a digital-to-analog converter, connected to the digital slope output, for producing at a D/A output terminal an analog slope voltage proportional to the sum of the number one and the number represented by the digital slope output, whereby the analog slope voltage is proportional to said slope number, and first resistor selector means, connected to the digital mantissa output, for connecting selected resistors between the D/A output terminal and the operational amplifier inverting input whose resistance values are inversely proportional to the numbers represented by the digital mantissa outputs, whereby a current is conducted through said first resistance in proportion to the product of the mantissa number and said slope number; and the offset means comprises:

a fixed voltage source, and second resistor selector means, connected to the digital slope output, for connecting selected resistors between the fixed voltage source and the operational amplifier inverting input whose resistance values are inversely proportional to the product of said slope number and a quantity equal to said slope number minus one, whereby a current proportional to the analog offset signal flows through the selected resistance.

* * * * *